United States Patent [19]

Moore

[11] 4,245,350
[45] Jan. 13, 1981

[54] AUTOMATIC GAIN CONTROL SYSTEM FOR DIRECT-ACCESS TELEVISION RECEIVER

[75] Inventor: Frederic J. Moore, Des Plaines, Ill.

[73] Assignee: Zenith Radio Corporation, Glenview, Ill.

[21] Appl. No.: 51,267

[22] Filed: Jun. 22, 1979

[51] Int. Cl.³ .............................................. H04B 1/26
[52] U.S. Cl. .................................. 455/180; 455/184; 455/200; 455/233; 455/319
[58] Field of Search ................ 455/179, 180, 183–186, 455/196, 200, 233, 318, 319, 199; 358/191.1

[56] References Cited

U.S. PATENT DOCUMENTS

| | | | |
|---|---|---|---|
| 2,082,961 | 6/1937 | Koch | 455/318 |
| 2,967,235 | 1/1961 | Braun et al. | 455/200 |
| 3,980,951 | 9/1976 | Breeze et al. | 455/180 |
| 4,024,476 | 5/1977 | Briggs | 455/185 |
| 4,160,213 | 7/1979 | Carter | 455/180 |

Primary Examiner—Marc E. Bookbinder

[57] ABSTRACT

A control system is described for use in a television receiver adapted to receive multi-band television signals and which has a direct-access type tuning system. In such a tuning system, the receiver employs at least one local oscillator, the output of which is applied to a prescaler for dividing down the frequency of the oscillator signal. Frequently, the oscillator signal fluctuates in amplitude as the oscillator is tuned from channel to channel and from one frequency band to another frequency band. To compensate for such amplitude fluctuations, the control system confines the amplitude of the oscillator signal to an amplitude range which the prescaler can reliably handle and applies the amplitude-controlled oscillator signal to the prescaler.

8 Claims, 4 Drawing Figures

AUTOMATIC GAIN CONTROL SYSTEM FOR DIRECT-ACCESS TELEVISION RECEIVER

BACKGROUND OF THE INVENTION

The present invention relates generally to television tuning systems and more particularly to so-called "direct-access" or "signal seeking" tuning systems.

In direct-access type tuning systems, a viewer is typically provided with a keyboard by which he can command the receiver to tune itself to a particular channel. The tuning system is programmed to "know" what its tuner's correct local oscillator frequency should be for the selected channel and develops a tuning voltage that will put the oscillator at the correct frequency.

In the process of tuning the oscillator, the oscillator frequency is constantly sensed by a frequency monitoring circuit which divides the oscillator frequency down to a lower frequency, counts the lower frequency, and compares it to a reference frequency. Any difference between the reference frequency and the oscillator's divided-down frequency results in the generation of a tuning voltage which is applied to the oscillator for reducing that frequency difference. When the reference frequency is equal to the oscillator's divided-down frequency, the oscillator is properly tuned.

To permit the frequency monitoring circuit to operate at relatively low frequencies rather than the higher frequencies associated with the oscillator, a so-called "prescaler" is disposed between the oscillator and the frequency monitoring circuit. The prescaler divides the oscillator frequency by a fixed number, 256 for example, and supplies the divided-down frequency to the frequency monitoring circuit. U.S. Pat. No. 3,980,958, assigned to the assignee of the present invention, discloses a tuning system employing such a prescaler.

One problem associated with the use of prescalers is that they are generally capable of operating properly only when the amplitude of their input from the oscillator is within a predetermined amplitude "window". Oscillator inputs to the prescaler which are either too large or too small and, hence, outside the prescaler's window, may be miscounted by the prescaler.

To illustrate this problem, it should be recognized that the outputs of VHF oscillators and UHF oscillators tend to vary in amplitude between minimum and maximum design limits for a given frequency. The amplitude of the oscillator outputs also varies as a function of frequency. Hence, it has been difficult to ensure that the amplitude of the oscillator outputs will be within the prescaler's window at all frequencies of interest.

In the past, this miscounting problem has been somewhat solved by adjusting the oscillator at the factory so that its output will remain substantially within the prescaler's window over the frequency range of interest. However, such factory adjustments tend to be time consuming and, therefore, expensive. Moreover, the oscillator may become misadjusted by subsequent handling of the receiver.

The problem noted above becomes particularly acute when the receiver is designed to receive multiband television signals, such as all VHF, UHF and CATV channels. For example, when the output of the VHF oscillator, used when CATV signals are received, sweeps from frequencies associated with the VHF band to frequencies associated with the CATV band, its output varies in amplitude considerably. In fact, the greatest fluctuation in the output of the VHF oscillator usually occurs as it changes from VHF bands to CATV bands, and vice versa. Such amplitude fluctuations, when added to those normally encountered in a receiver not adapted to receiver CATV channels, increase the difficulty in reliably interfacing the oscillators with the prescaler. Hence, direct-access tuning has not been readily achievable in television receivers designed to receive a multi-band television signals, particularly those receivers designed to receive CATV channels in addition to all VHF and UHF channels.

OBJECTS OF THE INVENTION

It is a general object of the invention to provide an improved direct-access tuning system for a television receiver.

It is a more specific object of the invention to provide such a tuning system in which a tuner's local oscillator is interfaced with a prescaler such that all oscillator inputs to the prescaler are reliably counted.

It is another object of the invention to provide such a tuning system for a television receiver adapted to receive all VHF, UHF and CATV channels, and to effect proper counting of the oscillator's output without the need for critical and time consuming factory adjustments to the oscillator.

BRIEF DESCRIPTION OF THE FIGURES

The objects stated above and other objects of the invention are more particularly set forth in the following detailed description and in the accompanying drawings, of which.

DESCRIPTION OF THE PREFERRED EMBODIMENT

Figure 1:
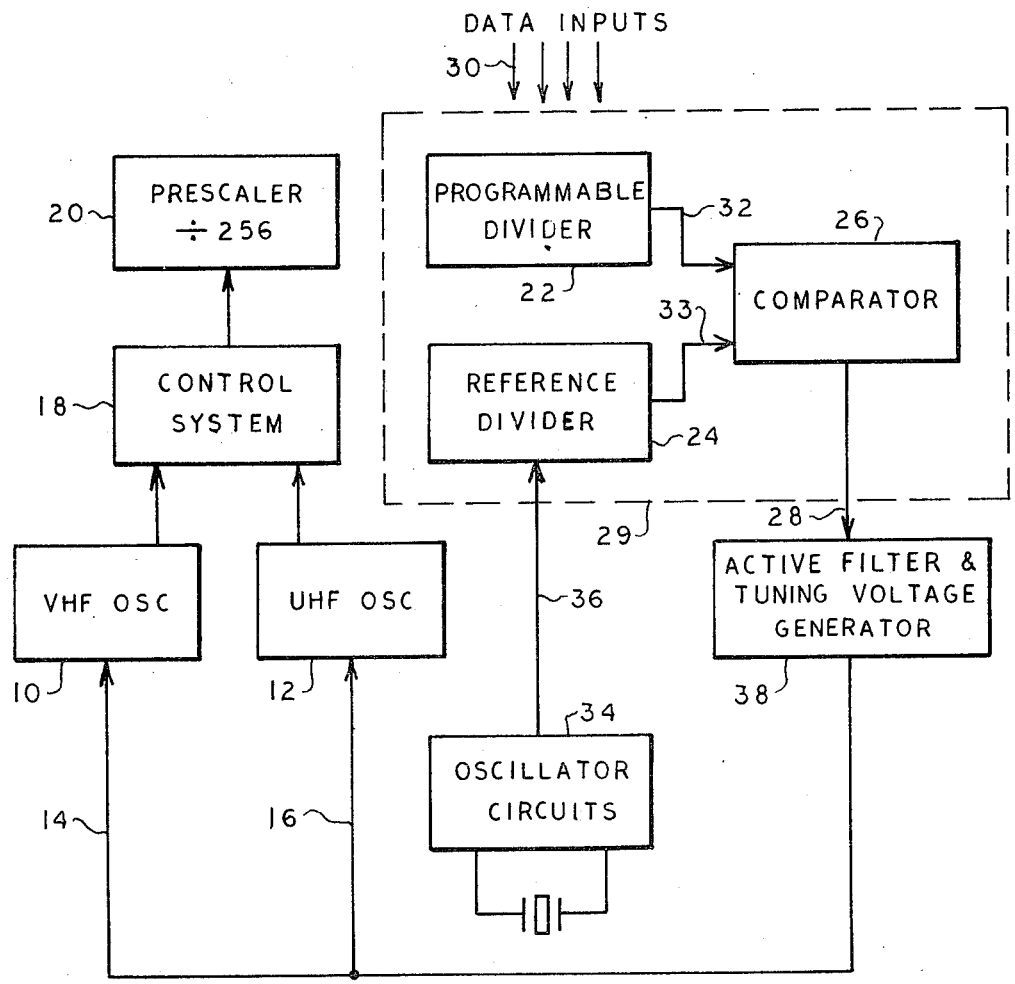
FIG. 1 is a block diagram of an exemplary direct-access tuning system in which the invention may be incorporated.

Referring to FIG. 1, an exemplary direct-access tuning system is shown in which the invention may be employed. The tuning system includes a VHF oscillator 10 and a UHF oscillator 12, each of which are tuned to their proper frequencies by a D.C. control signal on leads 14 and 16, respectively. Conventionally, the oscillators are tuned to a frequency which is 45 megahertz higher than the carrier frequency of a received television signal.

The oscillator output signals are coupled to a control system 18 which controls the magnitudes of the oscillator signals in a manner described hereinafter. Suffice it to say that, even though the amplitude of the signals from the oscillators 10 and 12 may vary appreciably from one frequency band to another, the control system 18 operates on the oscillator signals to confine their amplitudes to a predetermined range.

A prescaler 20 receives the RF (radio frequency) signal output of the control system 18, counts the frequency thereof, and divides it down to a lower frequency for further processing. Conventionally, the prescaler 20 divides the frequency of each signal it receives by a given factor such as 256. Hence, the circuitry "downstream" of the prescaler 20 need not be capable of operating at the higher RF frequencies associated with the oscillators 10 and 12.

A signal processing network, including a programmable divider 22, a reference divider 24, and a comparator 26, receives the output of the prescaler 20 and develops a signal at its output lead 28 for use in properly tuning the oscillators. As indicated by the dashed line 29, the dividers 22 and 24 and the comparator 26 may be fabricated on a single integrated circuit chip.

The programmable divider 22 receives the output of the prescaler 20 and data inputs 30 from a source (not shown) which may include a viewer-operable keyboard for selecting a desired channel. In response to its data inputs, the divider 22 divides the frequency of its input from the prescaler 20 by a programmed factor to develop on its output lead 32 a signal having a known frequency when the oscillators 10 or 12 are properly tuned. For example, when the data inputs 30 indicate that channel 2 is desired, the proper frequency of the oscillator 10 is 101 megahertz. That frequency is typically divided by 101000 to yield a one kilohertz signal at the lead 32. When the inputs 30 indicate that a different channel is desired (necessitating a different oscillator frequency) the factor by which the divider 22 divides is changed also so that the signal on lead 32 remains at a frequency of one kilohertz when proper tuning is achieved. In other words, when the oscillator in operation is properly tuned, the frequency of the signal on lead 32 is one kilohertz, irrespective of the oscillator frequency.

To determine whether the oscillator signal is of the proper frequency, the comparator 26 receives the signal on the lead 32 and a one kilohertz reference signal via a lead 33 from the divider 24. The latter signal may be generated by a single frequency, crystal controlled oscillator 34 whose output at lead 36 is divided by the divider 24 to provide a one kilohertz signal on lead 33.

When the signals received by the comparator 26 are equal in frequency, the comparator's output at lead 28 is zero. However, when there is a difference in frequency between the comparator's inputs, the comparator 26 develops an output which is filtered by a filter and tuning voltage generator 38 to provide a tuning voltage for changing the oscillator frequency. As the oscillator frequency is changed, the signal on the lead 32 eventually reaches one kilohertz, at which point proper tuning will have been achieved.

The tuning system described above need not include the control system 18 if the amplitude of the oscillator signals is within a range which is suitable for processing by the prescaler 20. However, it is frequently the case that the oscillators must be factory adjusted to meet that criteria. Moreover, where the tuning system is to be used in a receiver adapted to receive CATV signals, the oscillators may develop signals whose amplitude varies considerably. For example, when the receiver is switched from VHF channel 6 to CATV channel A, the oscillator signal generally decreases in amplitude by about twenty dbm. When the receiver is switched from channel A to VHF channel 13, the oscillator signal generally increases in amplitude by about twenty dbm. Another large change in the amplitude of the oscillator signal occurs when the receiver is switched from channel J to channel S.

Because of the large changes which occur in the amplitude of the oscillator signal as the receiver is switched to different channels, it is very difficult to hold the oscillator signals to an amplitude range which is compatible with the prescaler 20.

Another factor which contributes to the difficulty in holding the oscillator signal within the prescaler's amplitude range is the wide tolerance on the expected minimum and maximum amplitudes of the oscillator signal. This latter factor is best explained by reference to FIG. 2 in which the curves 40a and 40b, respectively, depict the maximum and minimum amplitudes of oscillator signals which the prescaler 20 is capable of reliably counting. Oscillator signals which are above or below the range between the curves 40a and 40b may not be counted accurately.

The curves 42a and 42b depict the expected maximum output of the VHF oscillator and the expected minimum output thereof, respectively. Although the maximum outputs of the VHF oscillator are all within the prescaler's range, the minimum expected outputs thereof are all considerably below that range. Moreover, the minimum expected outputs of the VHF oscillator vary considerably as function of frequency. For example, at 100 megahertz, the VHF oscillator's minimum expected output is approximately 26 dbm below the prescaler's range, whereas at 340 megahertz its minimum expected output is only approximately 12 dbm below the prescaler's range. Hence, amplifying the output of the VHF oscillator by a fixed factor sufficiently to bring it into the prescaler's range at 100 megahertz would cause the oscillator's output at 340 megahertz to be beyond the prescaler's range. In addition, it would be difficult to adjust the VHF oscillator so that its minimum and maximum expected outputs are within the prescaler's range at all frequencies for which the VHF oscillator is used.

The output of the UHF oscillator is depicted by curves 44a and 44b. As shown, the maximum expected output (curve 44a) of the UHF oscillator is within the prescaler's range, but the minimum expected output (curve 44b) is consistently below that range.

To provide the prescaler with oscillator inputs which are always within its range, irrespective of the oscillator frequency, the control system 18, when used with a two-oscillator receiver, combines the outputs of both oscillators to form a single RF signal which is amplitude controlled as shown by curve 46. Thus, for all oscillator signals whose frequencies lie within the VHF, CATV and UHF bands, the prescaler is provided with an RF input signal which is predictably within its range, all without time consuming factory adjustments to the oscillators.

Figure 3:
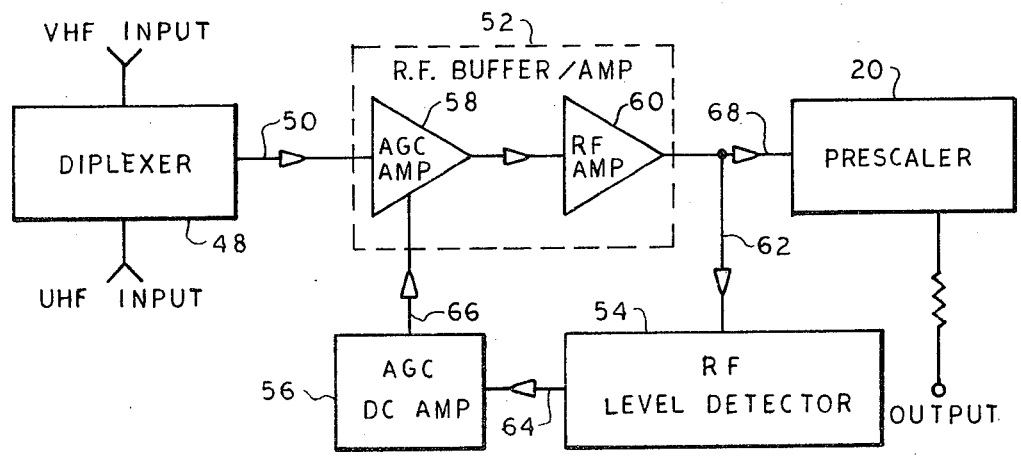
FIG. 3 is a block diagram of a system according to the invention for controlling the amplitude of oscillator inputs to a prescaler.
Figure 2:
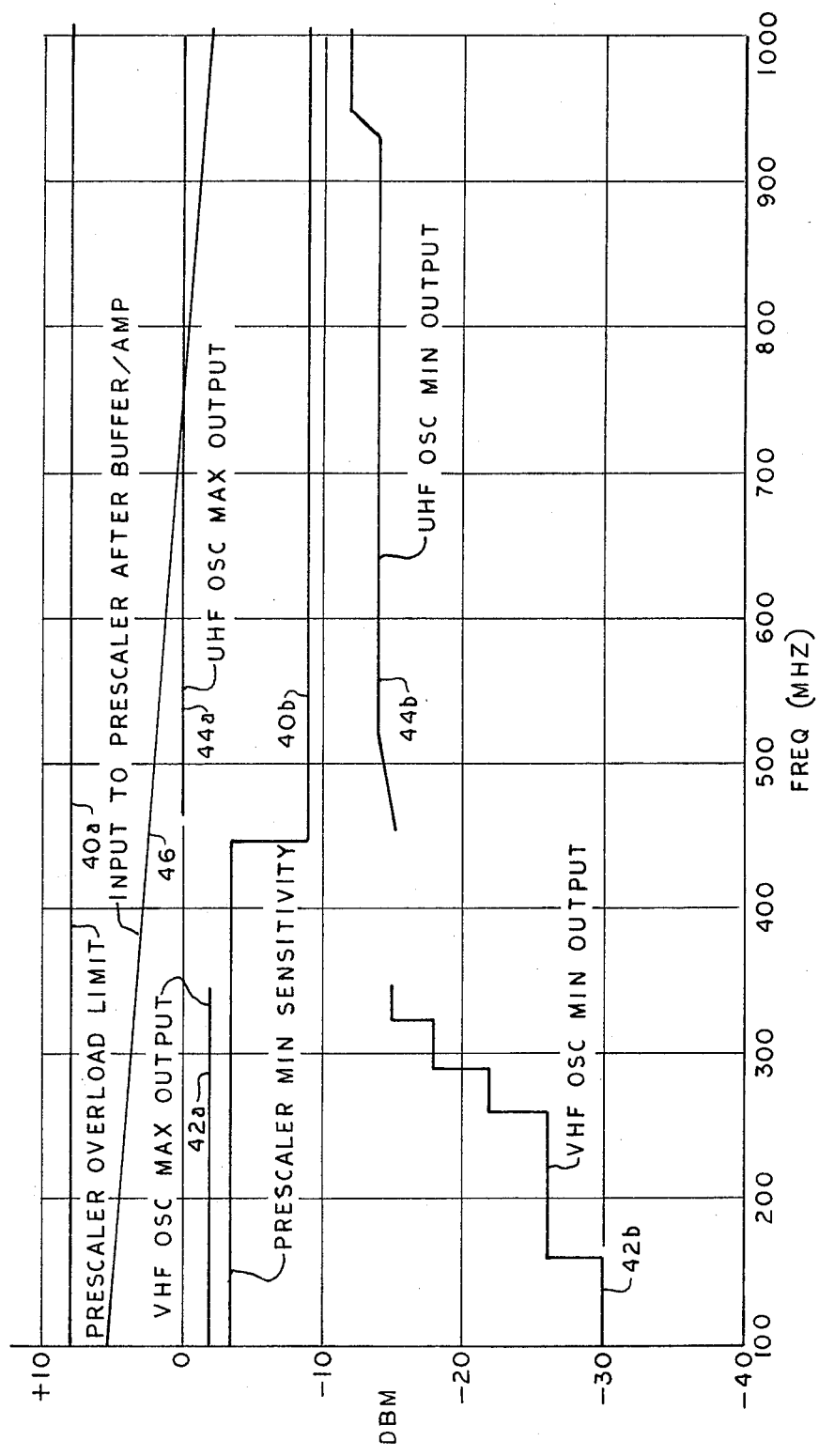
FIG. 2 is a set curves depicting the amplitude window of a prescaler and also depicting the amplitude variations in UHF and VHF oscillator outputs as a function of frequency.

Referring now to FIG. 3, there is shown a block diagram of the control system 18 which achieves the effect illustrated by the curve 46 of FIG. 2. As shown, the control system includes a diplexer 48 which receives the VHF and UHF outputs from the oscillators 10 and 12 (FIG. 1) and combines them to provide a single RF signal at the diplexer's outlet lead 50. At the latter lead, the oscillator signals may vary in amplitude as previously indicated in FIG. 2.

To control the gain of both the UHF and the VHF oscillator signals emanating from the diplexer, an AGC (Automatic Gain Control) loop is provided including an RF buffer/amplifier 52, an RF level detector 54 and a D.C. amplifier 56. Preferably, the amplifier 52 is a two-stage amplifier wherein the first stage is a gain-controlled AGC amplifier 58 and the second stage is an RF amplifier 60. In operation, the AGC amplifier 58 receives the RF signals from the lead 50 and a control signal from the amplifier 56 for amplifying the RF signal as a function of the value of the control signal. In this manner, both UHF and VHF signals are gain-controlled by the single AGC amplifier 58.

The output of the amplifier 58 is coupled to the input of the RF amplifier 60, the latter of which provides a fixed degree of amplification to the RF signal. The output of the RF amplifier 60 is coupled via a lead 62 to the input of the level detector 54. The level detector detects the amplitude of the amplifier RF signal from the amplifier 60 and generates a D.C. voltage at its output lead 64 indicative of the difference between the detected level of the RF signal and the prescaler's amplitude range. The D.C. amplifier 56 receives the signal generated by the level detector and amplifies it to develop a D.C. control voltage at its output lead 66. The control voltage thus developed is indicative of the gain required of the combination of the amplifiers 58 and 60 to bring the level of the amplifier RF signal at the output of the amplifier 60 to a level within the amplitude range of the prescaler. Hence, RF signals received from the diplexer 48 are gain-controlled such that their amplitudes at the output of the RF amplifier 60 follow the curve 46 shown in FIG. 2. The gain-controlled signals are fed via a lead 68 to the input of the prescaler 20 and from there applied to the programmable divider 22 shown in FIG. 1.

One advantage of the system shown in FIG. 3 is that a single amplifier 58 and its associated control loop components control the amplitude of both the UHF as well as the VHF oscillator signals. With this arrangement, the amplitude of the oscillator signals fed to the diplexer 48 can vary over a fairly wide range and yet be confined to the prescaler range by operation of the AGC control loop. Such control of the amplitude of the signal applied to the prescaler eliminates the factory adjustments otherwise needed to achieve some control over the amplitude of the signals developed by the oscillators.

The type of gain control described above may also be employed in a receiver adapted to receive multi-band television signals and having but a single oscillator. For example, the receiver may be designed to receive CATV and VHF channels and employ a single oscillator which is tuneable over the frequencies associated with the CATV and VHF frequency bands. For such a receiver, the diplexer 48 may be eliminated and the output of the single oscillator may be coupled directly to the buffer amplifier 52. In this manner, the amplitude fluctuations which occur in the oscillator signal as the oscillator is tuned from channel to channel and from band to band are compensated for by the operation of the control system.

Figure 4:
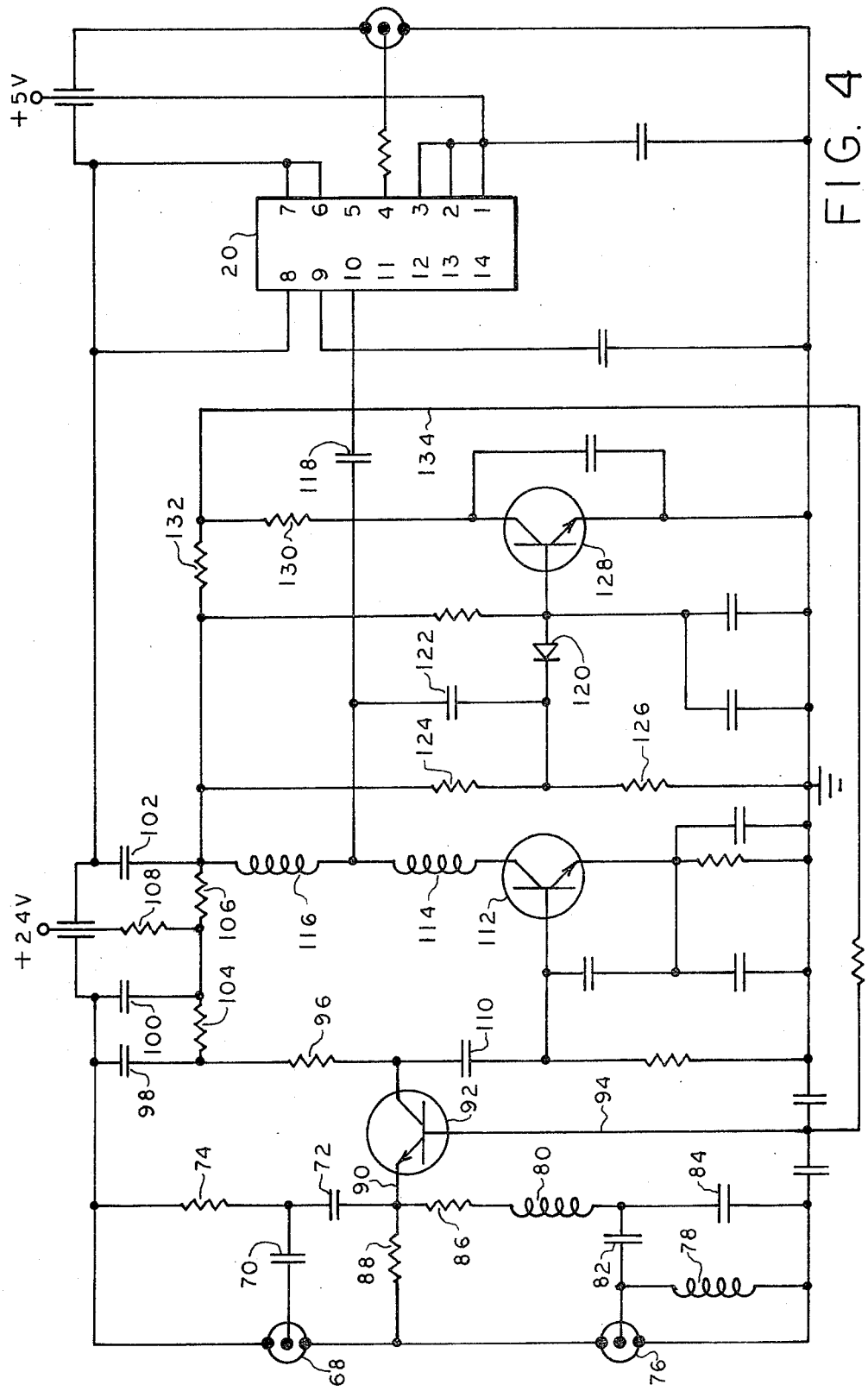
FIG. 4 is a detailed circuit diagram of an embodiment of the control system shown in FIG. 3.

A preferred circuit arrangement for effecting the functions of the system shown in FIG. 3 is illustrated in FIG. 4, to which reference is now made. As shown, the circuit includes a UHF input circuit including an input terminal 68 coupled to capacitors 70 and 72, and a resistor 74. A VHF input circuit includes an input terminal 76 coupled as shown with coils 78 and 80, capacitors 82 and 84, a resistor 86, and another resistor 88 which is common to the UHF and VHF input circuits. The combination of the UHF input circuit and the VHF input circuit functions as a diplexer to provide a combined RF signal at a lead 90 for application to a transistor 92, the latter of which functions as the AGC amplifier 58 of FIG. 3.

The transistor 92 is operated in the so-called forward AGC mode wherein it receives a D.C. control signal on its base lead 94, and develops an amplified output across its load resistor 96, the amplitude of the output signal decreasing as the amplitude of the control voltage increases. Coupled to the load resistor 96 are capacitors 98, 100 and 102 and resistors 104, 106 and 108 for decoupling the networks to which they are connected from each other and from the 24 volt power supply voltage.

The output of the transistor 92 is coupled via a capacitor 110 to the base of another transistor 112, the latter of which functions as the RF amplifier 60 shown in FIG. 3. The collector of the transistor 112 is coupled to coils 114 and 116 to form an impedance match with the input to the prescaler 20, shown in FIG. 4 as an integrated circuit. Coupling between the output of the transistor 112 and the prescaler is effected by a capacitor 118 connected between pin 10 of the prescaler 20 and the junction between coils 114 and 116.

To detect the level of the RF signal at the output of the transistor 112, a hot carrier diode 120 is coupled via a capacitor 122 to the junction between the coils 114 and 116. Also coupled to the junction of the diode 120 and the capacitor 122 is a voltage divider comprising resistors 124 and 126, the combination of which establishes a D.C. reference voltage to determine when the diode 120 conducts.

The anode of the diode is coupled to the base of another transistor 128 which serves the function of the D.C. amplifier 56 in FIG. 3. In response to changes in the amplitude of the signal detected by the diode 120 the conduction of transistor 128 changes to thereby change its collector voltage and the value of the control signal applied to the transistor 92.

More specifically, assuming that the level of the RF signal appearing at the junction of coils 114 and 116 is larger than desired, the diode 120 conducts and thereby lowers the voltage at its anode. Consequently, the conduction level of the transistor 128 is reduced and the voltage at the junction of its collector resistors 130 and 132 increases. This increase in voltage is coupled via a lead 134 to the base lead 94 of the transistor 92, thus causing the transistor 92 to decrease its amplification of the RF signal received from lead 90. Conversely, a decrease in the amplitude of the RF signal applied to the diode 120 causes the voltage at the base of the transistor 128 to increase. As a result, the voltage at the junction of the resistors 130 and 132 decreases, thereby increasing the gain of the transistor 92. Thus, any change in the amplitude of the signal received by the diode 120 is compensated for by a corresponding change in the gain of the transistor 92. As a result, the amplitude of oscillator signals applied to the prescaler substantially follows the curve 46 in FIG. 3.

The control system described above provides a simple yet reliable control over the amplitude of oscillator signals supplied to a prescaler. Very little, if any, factory adjustment of either the VHF or the UHF oscillator is required to ensure that the prescaler functions properly at all frequencies of interest. Variations in the operation of the prescaler which might otherwise occur from receiver to receiver are eliminated.

Although the invention has been described in terms of a preferred embodiment, it will be obvious to those skilled in the art that many modifications thereto may be made. By way of example only, the forward AGC transistor 92 may be replaced by a so-called PIN diode. Other such modifications may also be made. It is intended, therefore, that all such alterations and modifications be included within the spirit and scope of the invention as defined by the appended claims.

What is claimed is:

1. In a television receiver adapted to receive multiband television signals and having a direct access tuning system including at least one local oscillator which is tuneable over a plurality of the receivable television bands, and having a prescaler for counting and dividing-down the signal generated by the local oscillator to develop a lower frequency oscillator signal for further processing by the tuning system, a control system for automatically compensating for amplitude variations in the oscillator signal as the oscillator is tuned from channel to channel and from band to band so as to confine the amplitude of the oscillator signal to a predetermined amplitude range within which the prescaler is adapted to count, comprising:

gain-control means receiving a control signal and the oscillator signal for controlling the amplitude of the oscillator signal as a function of the value of the control signal;

means receiving the gain-controlled oscillator signal from said gain-control means for detecting the amplitude thereof and for generating the control signal whose value is representative of the difference between the detected amplitude of the gain-controlled oscillator signal and the prescaler's amplitude range;

means for applying the control signal to said gain-control means to adjust its gain such that the gain-controlled oscillator signal has an amplitude within the predetermined amplitude range of the prescaler irrespective of the frequency to which the oscillator is tuned; and means for applying the gain-controlled oscillator signal to the prescaler, whereby an oscillator signal whose amplitude fluctuates as the oscillator is tuned from channel to channel and from band to band is automatically brought within the amplitude range of the prescaler and is thereby reliably counted and divided-down by the prescaler.

2. In a television receiver having a direct-access tuning system including a VHF local oscillator, a UHF local oscillator, a prescaler for counting and dividing-down the signals generated by the local oscillators to develop lower frequency oscillator signals for further processing by the tuning system, a control system for automatically adjusting the amplitude of the signals from the oscillators to a predetermined amplitude range within which the prescaler is adapted to count, comprising:

means for combining the outputs of the VHF and UHF oscillators to generate a single RF signal;

gain-control means receiving a control signal and the RF signal for controlling the amplitude of the RF signal as a function of the value of the control signal;

means for detecting the amplitude of the RF signal output of said gain-control means and for generating the control signal whose value is representative of the difference between the detected amplitude of the RF signal output and the prescaler's amplitude range;

means for applying the control signal to said gain-control means to adjust its gain such that its RF signal output has an amplitude within the predetermined amplitude range of the prescaler irrespective of the frequency of the RF signal; and means for applying the RF signal output of said gain-control means to the prescaler, whereby oscillator signals having amplitudes which are beyond the amplitude range of the prescaler are automatically adjusted to the latter range and are thereby reliably counted and divided-down by the prescaler.

3. A control system as set forth in claim 2 wherein the receiver is adapted to receive television signals in the VHF, CATV and UHF bands, and wherein said gain-control means is adapted to control the amplitude of RF signals which are generated by the oscillators in response to receipt of a television signal in any of said bands.

4. A control system as set forth in claim 3 wherein said combining means includes a diplexer.

5. A control system as set forth in claim 4 wherein said gain-control means includes an amplifier adapted to operate in a forward AGC mode.

6. In a television receiver adapted to receive VHF, UHF and CATV signals and having a direct-access tuning system including a VHF local oscillator, a UHF local oscillator, a prescaler for counting and dividing-down the local oscillator signals to develop lower frequency oscillator signals for further processing by the tuning system, a control system for automatically adjusting the amplitude of the oscillator signals to a predetermined amplitude range within which the prescaler is adapted to count, comprising:

a diplexer for receiving the VHF and UHF oscillator signals and for combining said signals to generate a single RF signal;

a gain-controlled amplifier receiving a control signal and the RF signal for amplifying the RF signal as a function of the value of the control signal;

a second amplifier receiving the amplified RF signal for further amplification thereof;

means receiving the amplified RF signal from said second amplifier for generating the control signal such that the value thereof is representative of the difference between the amplitude of the amplified RF signal and the prescaler's amplitude range;

means for applying the control signal to said gain-controlled amplifier to adjust its gain such that the RF signal output of said second amplifier has an amplitude within the predetermined amplitude range of the prescaler irrespective of the frequency of the RF signal; and means for applying the RF signal output of said second amplifier to the prescaler.

7. A control system as set forth in claim 6 wherein said control signal generating means includes a detector for detecting the amplitude of the RF signal output of said second amplifier.

8. A control system as set forth in claim 7 wherein said detector includes a hot carrier diode.

\* \* \* \* \*